(12) United States Patent
Ngo et al.

(10) Patent No.: US 6,803,265 B1
(45) Date of Patent: Oct. 12, 2004

(54) LINER FOR SEMICONDUCTOR MEMORIES AND MANUFACTURING METHOD THEREFOR

(75) Inventors: Minh Van Ngo, Fremont, CA (US); Arvind Halliyal, Cupertino, CA (US); Tazrien Kamal, San Jose, CA (US); Hidehiko Shiraiwa, San Jose, CA (US); Rinji Sugino, San Jose, CA (US); Dawn M. Hopper, San Jose, CA (US); Pei-Yuan Gao, San Jose, CA (US)

(73) Assignee: FASL LLC, Sunnyvale, CA (US)

( * ) Notice: Subject to any disclaimer, the term of this patent is extended or adjusted under 35 U.S.C. 154(b) by 9 days.

(21) Appl. No.: 10/109,234

(22) Filed: Mar. 27, 2002

(51) Int. Cl.[7] .............................................. H01L 21/337
(52) U.S. Cl. ...................... 438/188; 438/197; 438/262; 438/447
(58) Field of Search .................... 438/188, 238, 438/447, 197, 199, 210, 262, 151, 585, 294

(56) References Cited

U.S. PATENT DOCUMENTS 5,087,589 A * 2/1992 Chapman et al. ........... 438/467
6,338,993 B1 * 1/2002 Lien ............................ 438/238
6,429,093 B1 * 8/2002 Xia et al. .................... 438/447

* cited by examiner

Primary Examiner—W. David Coleman
Assistant Examiner—Kheim Nguyen
(74) Attorney, Agent, or Firm—Mikio Ishimaru

(57) ABSTRACT

A manufacturing method for an integrated circuit memory includes providing a semiconductor substrate and depositing a charge-trapping dielectric layer. First and second bitlines are implanted and a wordline layer is deposited. A hard mask layer is deposited over the wordline layer. A photoresist is deposited over the wordline layer and used to form a hard mask. The photoresist is removed. The wordline layer is processed using the hard mask to form a wordline and the hard mask is removed. A reduced hydrogen, ultra-violet block data retention liner covers the wordline and the charge-trapping dielectric layer. The reduced hydrogen levels reduce the charge loss compared to prior art. The surface of the liner is processed to block UV light before completing the integrated circuit.

20 Claims, 6 Drawing Sheets

LINER FOR SEMICONDUCTOR MEMORIES AND MANUFACTURING METHOD THEREFOR

BACKGROUND OF THE INVENTION

1. Technical Field

The present invention relates generally to semiconductor technology and data retention in semiconductor memories.

2. Background Art

Various types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost EPROM, in contrast, is less expensive and has greater density but lack erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phone, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

An even newer technology allowing multiple bits to be stored in a single cell is known as "MirrorBit®" Flash memory has been developed In this technology, a memory cell is essentially split into two identical (mirrored) parts, each of which is formulated for storing one of two independent bits. Each MirrorBit Flash memory cell, like a traditional Flash cell, has a gate with a source and a drain. However, unlike a traditional Flash cell in which the source is always connected to an electrical source and the drain is always connected to an electrical drain, each MirrorBit Flash memory cell can have the connections of the source and drain reversed during operation to permit the storing of two bits.

The MirrorBit Flash memory cell has a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

A major problem with the MirrorBit architecture has been in data retention. It has been discovered that a memory cell sometimes gives a false appearance of a charged state or a bit of data being present when it is not. At other times, the memory cell drops to an uncharged state or a bit of data being absent when it should not be uncharged or absent. It has been difficult to determine what causes this data retention problem and, thus, how to correct it.

A solution to this problem has been long sought but has long eluded those skilled in the art.

DISCLOSURE OF THE INVENTION

The present invention provides a manufacturing method for an integrated circuit memory, which includes a semiconductor substrate having a charge-trapping dielectric layer. First and second bitlines are implanted and a wordline layer is deposited. A hard mask layer is deposited over the wordline layer. A photoresist is deposited over the wordline layer and used to form a hard mask. The photoresist is removed. The wordline layer is processed using the hard mask to form a wordline and the hard mask is removed. A reduced-hydrogen, ultra-violet block data retention liner covers the wordline and the charge-trapping dielectric layer. The reduced hydrogen levels reduce the charge loss compared to prior art. The surface of the liner is processed to block UV light before completing the integrated circuit.

It was discovered that the data retention problem is actually two problems. First, it was discovered that ultraviolet light on the charge-trapping dielectric layer can gave the false appearance of the charged state. Since the memory cells are subject to different types of environments and different intensities of light in the same environment, the false appearance of a charged state was unpredictable. Second, it was discovered that hydrogen in the memory cell can cause charge loss firm the charge-trapping dielectric layer. This was discovered to be a result of the backend processes, which contain hydrogen.

The above and additional advantages of the present invention will become apparent lo those skilled in the art from a reading of the following detailed description when taken in conjunction with the accompanying drawings.

BEST MODE FOR CARRYING OUT THE INVENTION

Figure 1:
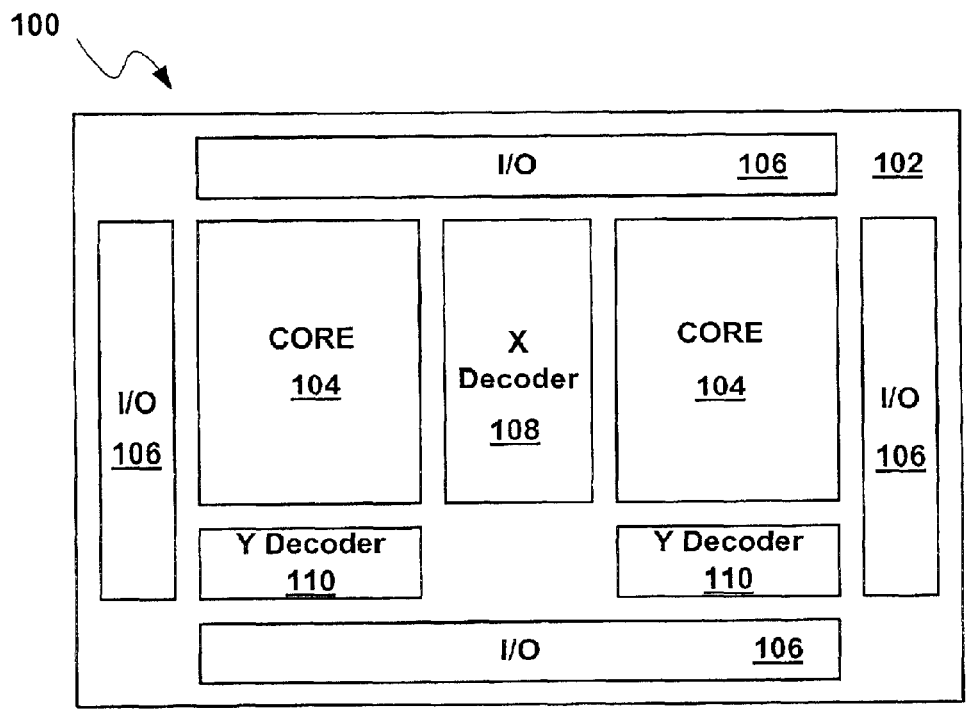
FIG. 1 is a plan view of a MirrorBit Flash EEPROM in accordance with the present invention.

Referring now to FIG. 1, therein is shown a plan view of a MirrorBit® Flash EEPROM 100, which commonly includes a semiconductor substrate 102 in which one or more high-density core regions and one or more low-density peripheral portions are formed. High-density core regions typically include one or more M×N array cores 104 of individually addressable, substantially identical MirrorBit Flash memory cells. Low-density peripheral portions typically include input/output (I/O) circuitry and programming circuitry for selectively addressing the individual memory cells. The programming circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, reading, and erasing, and deriving necessary voltages to effect such operations.

The term "horizontal" as used in herein is defined as a plane parallel to the conventional plane or surface the semiconductor substrate 102 regardless of its orientation. The term "vertical" refers to a direction perpendicular to the horizontal as just defined. Terms, such as "on", "above", "below", "higher", "lower", "over", "under", "side" and "beside", are defined with respect to these horizontal and vertical planes. The term "processed" as used herein is defined to include one or more of the following: depositing or growing semiconductor materials, masking, patterning, photolithography, etching, implanting, removal, and/or stripping.

Figure 2:
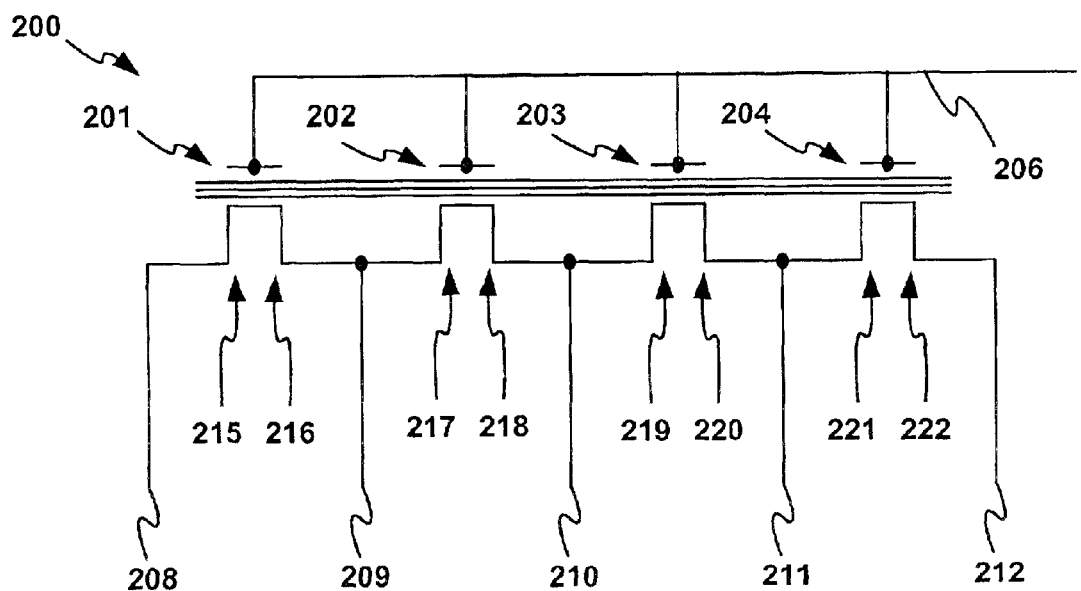
FIG. 2 is a circuit schematic of a portion of one of the M×N array cores of FIG. 1.

Referring now to FIG. 2, therein is shown a circuit schematic of a portion of one of the M×N array cores 104 of FIG. 1. The circuit schematic shows a line of memory cells 200, which includes memory cells 201 through 204 and which together can form an 8-bit word. Each of the memory cells 201 through 204 is connected to a wordline 206, which acts as a control gate. Each of the memory cells 201 through 204 has two associated bitlines with most of the memory cells having a common bitline. The memory cell 201 has associated bitlines 208 and 209; the memory cell 202 has associated bitlines 209 and 210; the memory cell 203 has associated bitlines 210 and 211; and the memory cell 204 has associated bitlines 211 and 212.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. Although adjacent memory cells share common bitlines, the adjacent memory cells do not interfere with each other because the memory cells are programmed one at a time and only one memory cell is active at a time while programming.

Figure 3:
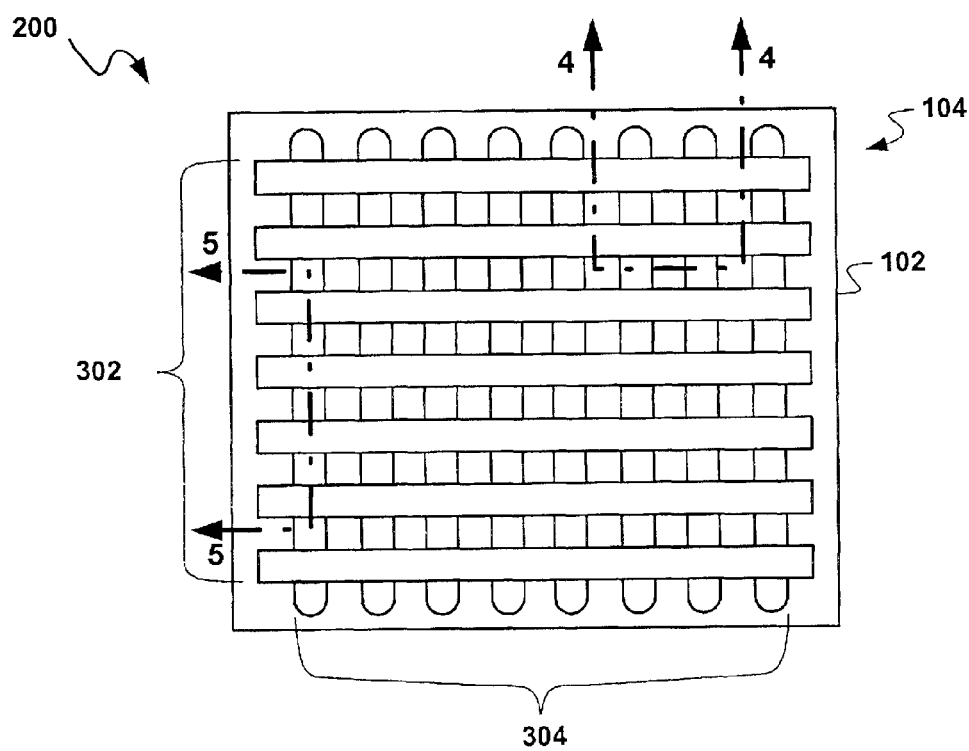
FIG. 3 is a plan view of a portion of one of the M×N array cores 104 of FIG. 1.

Referring now to FIG. 3, therein is shown a plan view of a portion of one of the M×N array cores 104 of FIG. 1. The semiconductor substrate 102 has a plurality of implanted bitlines 304 extending in parallel with a plurality of formed wordlines 302 extending in parallel and at right angles to the plurality of implanted bitlines 304. The wordlines 302 and bitlines 304 have contacts and interconnections (not shown) to the programming circuitry represented in part by x-decoders 108 and y-decoders 110 of FIG. 1.

Figure 4:
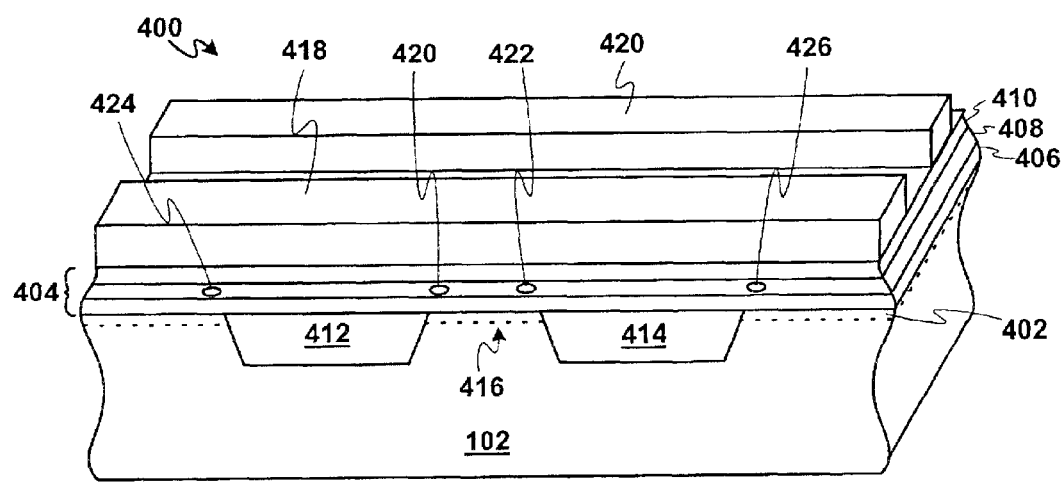
FIG. 4 is a cross-sectional isometric view of a MirrorBit Flash memory cell along the line 4—4 of FIG. 3 before deposition of a liner in accordance with the present invention.

Referring now to FIG. 4, therein is shown a cross-sectional isometric view of a typical MirrorBit Flash memory cell along the line 4—4 of FIG. 3, such as a memory cell 400. The semiconductor substrate 102 is a p-doped silicon substrate with a threshold adjustment implant 402 of a p-type material, such as boron. The threshold adjustment implant 402 provides a region that is more heavily doped than the semiconductor substrate 102 itself and assists in the control of the threshold voltage of the memory cell 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are of an oxide dielectric such as silicon dioxide ($SiO_2$) and the charge-trapping layer 408 is of a nitride dielectric such as silicon nitride ($Si_xN_y$). The oxide-nitride-oxide configuration is frequently referred to as a matter of convenience as an "ONO layer".

The bitlines 304 of FIG. 3 are implanted under the charge-trapping dielectric layer 404 in the semiconductor substrate 102 as typified by first and second conductive bitlines 412 and 414. They are typically of an implanted n-type material, such as arsenic, and can include an oxide portion (not shown) in some embodiments. The first and second conductive bitlines 412 and 414 are spaced apart and define a volume between them with the threshold adjustment implant 402, which is a channel 416.

A material, such as polysilicon, is deposited over the charge-trapping dielectric layer 404, patterned, etched, and stripped resulting in a wordline 418. The wordline 418 is one of the wordlines 302 in FIG. 3.

It is understood that the implementation of each step in manufacturing has associated processing steps.

The locations 420 through 422 indicate where bits can be stored in the memory cell 400 and locations 424 and 426 are adjacent locations, which are independent of the memory cell 400.

Figure 5:
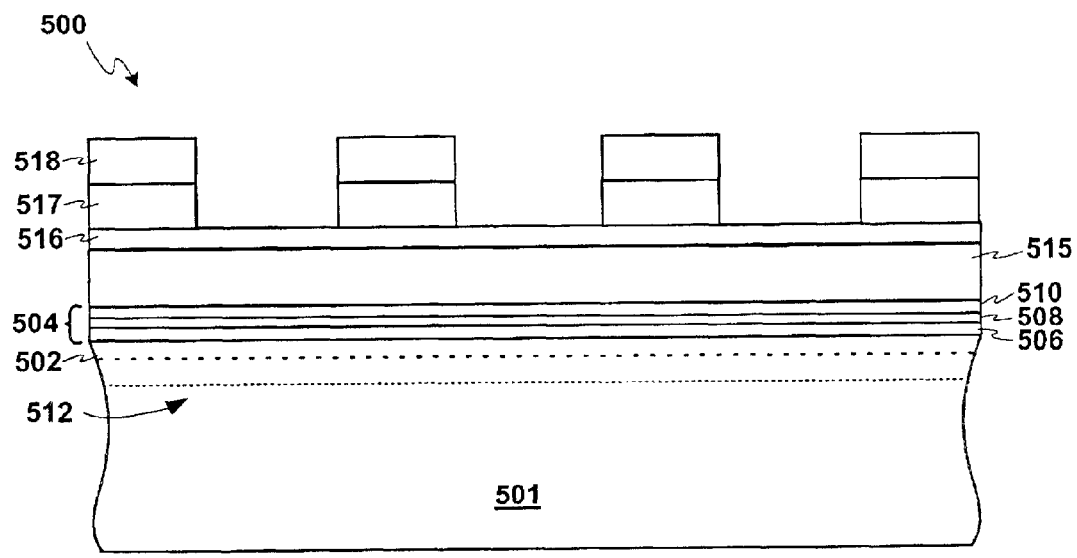
FIG. 5 is a cross-sectional view of a partially processed memory cell similar to a cross-sectional view along line 5—5 in FIG. 3 having a patterned photoresist and ARC material.

Referring now to FIG. 5, therein is shown a cross-sectional view of a partially processed memory cell 500 similar to a cross-sectional view along line 5—5 in FIG. 3. A p-type silicon substrate 501 has been implanted or processed with a p-type threshold adjustment implant 502.

A charge-trapping dielectric layer 504 is deposited over the silicon substrate 501. The charge-trapping dielectric layer 504 generally can be composed of three separate layers: a first insulating layer 506, a charge-trapping layer 508, and a second insulating layer 510. The first and second insulating layers 506 and 510 may be of an oxide dielectric such as silicon dioxide ($SiO_2$) and the charge-trapping layer 508 may be of a nitride dielectric such as silicon nitride ($Si_xN_y$) to form an ONO layer. It will be noted that the present invention is not limited to specific dielectric or charge-trapping materials.

The bitlines, as typified by a first n-type bitline 512, are implanted under the charge-trapping dielectric layer 504 in the silicon substrate 501 and a wordline material 515, such as polysilicon, has been deposited over the charge-trapping dielectric layer 504. Again, it will be noted that the present invention is not limited to specific bitline or gate materials. For example, NPN structures are shown but the structures can also be PNP.

A hard mask material 516 has been deposited over the wordline material 515 and has not been processed. The hard mask material 516 can act as an ARC or an ARC can be deposited as a separate layer, such as an optional ARC material 517, but more importantly, the hard mask material 516 is formulated to be a material that can be stripped off the wordline material 515 without the stripping process damaging any exposed portion of the charge-trapping dielectric layer 504 at the same time.

In order to be strippable without damaging the charge-trapping dielectric layer 504, the hard mask material 516 should be properly formulated to not affect the middle layer of the charge-trapping dielectric layer 504. For example, where the nitride layer is the middle layer, an oxide such as silicon oxide would be the proper formulation.

A photoresist 518 has been deposited over the hard mask material 516 or the optional ARC material 517. The optional ARC material 517, the hard mask material 516 and the photoresist 518 have been processed to form openings 521 through 523 to expose the wordline material 515.

In FIG. 5, both the photoresist 518 and the optional ARC material 517 have been processed (i.e., the materials have been deposited, masked, patterned, exposed, and etched) for processing the hard mask material 516.

Figure 6:
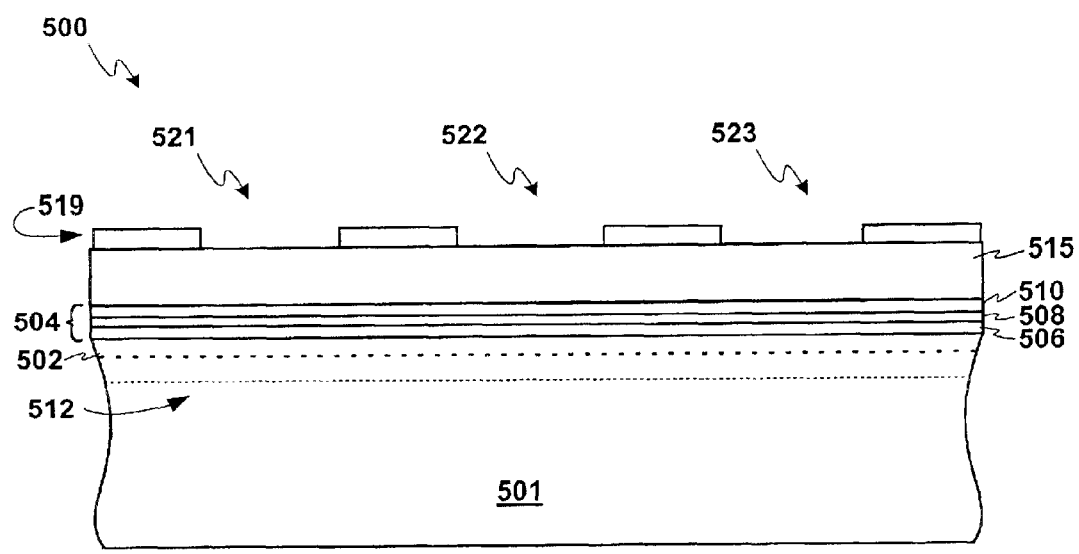
FIG. 6 is the structure of FIG. 5 after formation of a hard mask and removal of the patterned photoresist and the ARC material.

Referring now to FIG. 6, therein is shown the structure of FIG. 5 after formation of a hard mask 519 and removal of the photoresist 518 and the optional ARC material 517. The hard mask 519 alone is used to create the structure of FIG. 7.

Figure 7:
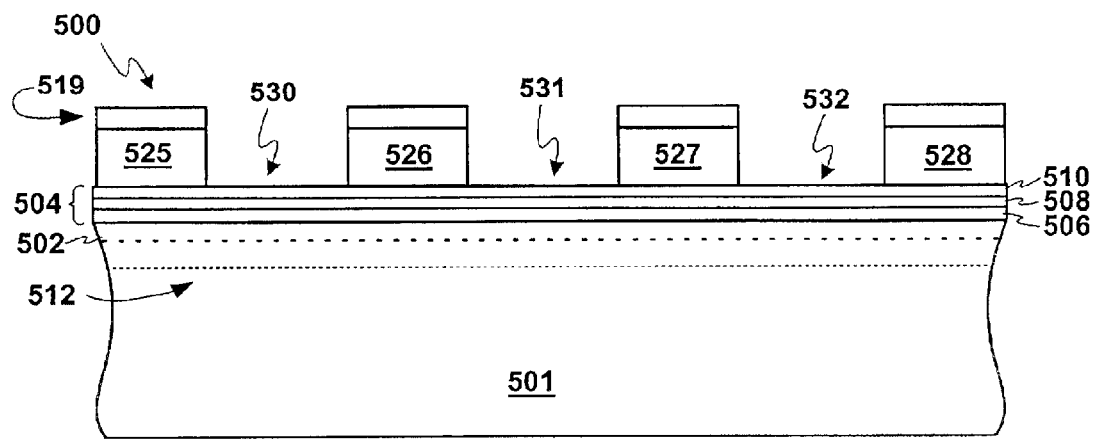
FIG. 7 is the structure of FIG. 6 after processing using the hard mask to form wordlines.

It should be noted that in the past, the photoresist and ARC would be used to create the wordlines 525 through 528 (without the hard mask material 516) of FIG. 7 so the ONO layer would be exposed between the wordlines and the problems noted above would occur.

Referring now to FIG. 7, therein is shown the structure of FIG. 6 after processing using the hard mask 519 to form wordlines 525 through 528. The processing using the hard mask 519 exposes the charge-trapping dielectric layer 504 at exposed areas 530 through 532. However, since the hard mask material 516 material is specifically formulated so as to not damage the charge-trapping dielectric layer 504 during removal, the charge-trapping dielectric layer 504 will not be damaged at the exposed areas 530 through 532 when the hard mask 519 is removed.

For example, where the hard mask 519 is of silicon oxide, its removal would only cause openings in the top oxide layer of the ONO layers and not of the nitride layer. Thus, the subsequent pre-metal deposition oxide strip and oxide spacer etch photoresist strip would not penetrate the nitride layer. This would leave the nitride layer and the bottom oxide layer to protect the semiconductor substrate.

Figure 8:
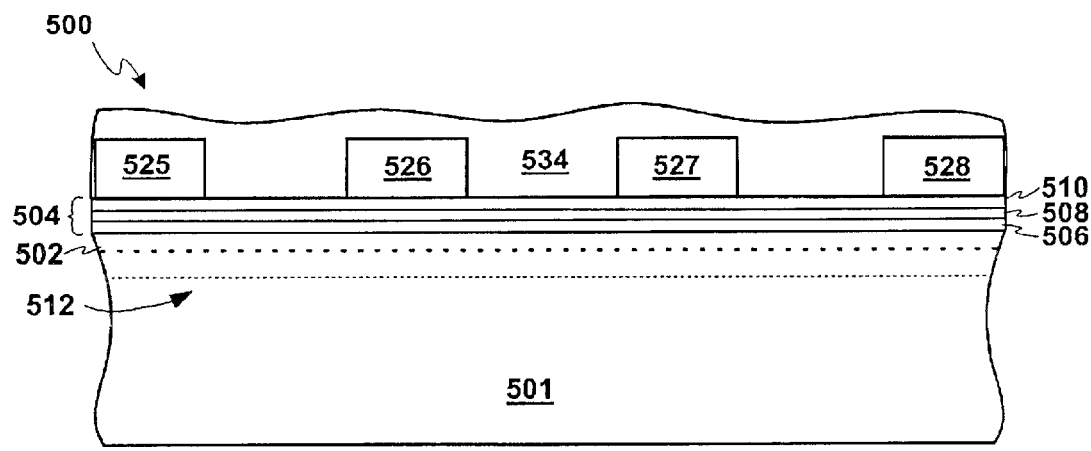
FIG. 8 is the structure of FIG. 7 after deposition of a spacer material.

Referring now to FIG. 8 therein is shown the structure of FIG. 7 after removal of the hard mask 519. An inorganic spacer material 534 has been deposited because it is required for the peripheral portions of the Flash EEPROM 100 of FIG. 1.

Figure 9:
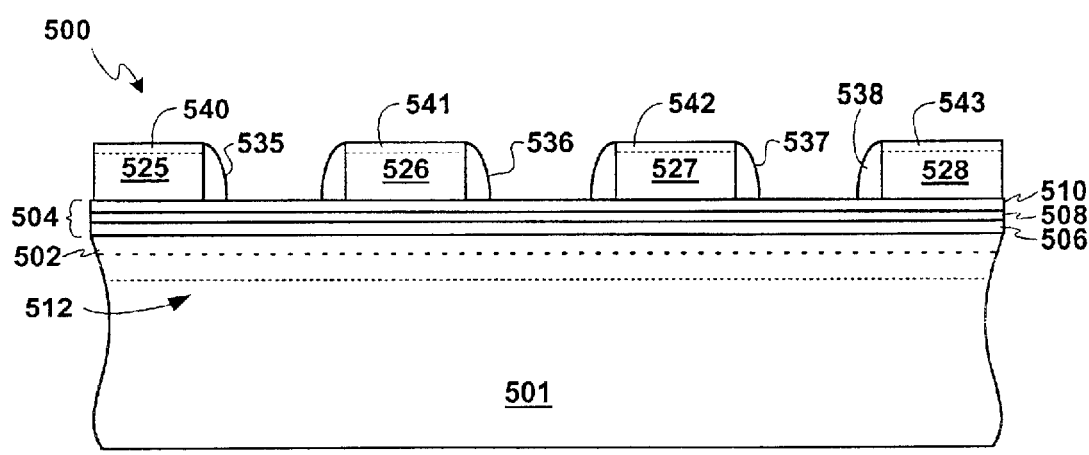
FIG. 9 is the structure of FIG. 8 after processing the spacer material to form spacers and after saliciding of the wordlines.

Referring now to FIG. 9, therein is shown the structure of FIG. 8 after etching of the spacer material 534 to form spacers 535 through 538 around the respective wordlines 525 through 528. If the spacers 535 through 538 are not formed, an additional masking step of the entire core is required or additional processing steps to provide access to the bitlines.

The memory cell 500 is also shown after application of the saliciding process to grow metal salicides 540 through 543, such as cobalt silicide, titanium silicide, or nickel silicide contacts on top of the respective wordlines 525 through 528.

Since the metal silicide will not form on the exposed ONO layer or the nitride spacers, which do not contain silicon, the metal silicide will be self-aligned on the tops of the polysilicon wordlines; i.e., salicide will be grown.

As explained earlier, a major problem with the MirrorBit architecture has been discovered that a memory cell sometimes gives a false appearance of a charged state or a bit of data being present when it is not. At other times, the memory cell gives a false appearance of an uncharged state or a bit of data being absent when it is not. It has been difficult to determine what causes this problem and, thus, how to correct it.

After much study, it was discovered that this problem is actually two problems.

First, it was discovered that ultra-violet light on the charge-trapping dielectric layer can gave the false appearance of the charged state. Since the memory cells are subject to different types of environments and different intensities of light in the same environment, the false appearance of a charged state was unpredictable.

Second, it was discovered that hydrogen in the memory cell can cause charge loss from the charge-trapping dielectric layer. This was discovered to be a result of the backend of process (after memory cell manufacture) processes, which contain hydrogen.

Figure 10:
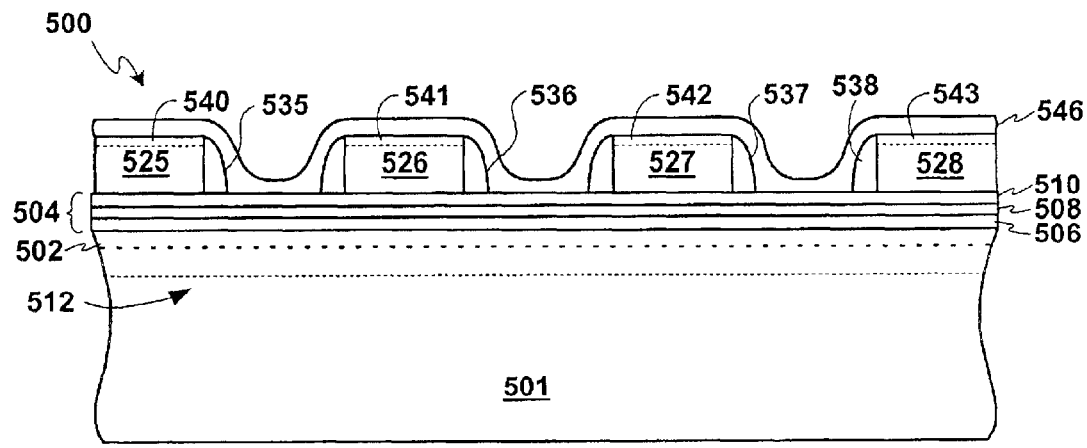
FIG. 10 is the structure of FIG. 9 after the deposition of a liner in accordance with the present invention.

Referring now to FIG. 10, therein is shown the structure of FIG. 9 after deposition of a data retention liner 546 in accordance with the present invention. The data retention liner 546 is deposited over the surface of the wordlines 525 through 528, the spacers 535 through 538, and the charge-trapping dielectric layer 504. To solve the second problem of charge loss, the data retention liner 546 according to the present invention has the characteristic of having reduced hydrogen by being deposited by a low hydrogen retention process.

The term "reduced hydrogen" as used herein means that the data retention liner 546 has under about 3% nitrogen-hydrogen and silicon-hydrogen bondings based on Fourier transformation infra-red (FTIR) data.

In one embodiment, the liner is a silicon nitride (SiN) and is formed by performing a plasma enhanced chemical vapor deposition (PECVD) of hydrosilane nitride (SiH$_4$) at a high temperature from 500° C. to 600° C. in an ammonia atmosphere. It would be understood that the PECVD deposition at 500° C. to 600° C. makes the SiN low hydrogen, whereas prior art techniques performed at lower temperatures below 400° C. did not. The reduction in hydrogen over the prior art reduces the amount of hydrogen to act as a carrier of electrical charge, thus greatly diminishing the data retention problem. In addition the PECVD deposition increases film density, thus making the data retention liner of greater density than other deposition processes and thus less susceptible to hydrogen entrapment. With higher density comes the characteristic of being less permeable to hydrogen. The data retention liner 546 may also be used as an etch stop layer.

To solve the first problem, the deposition of the data retention liner 546 includes the addition of an UV blocking agent to prevent UV light from reaching the charge-trapping dielectric layer 504.

One method for a silicon nitride liner is a silicon (Si) ion implant process performed at the surface of the liner.

Another method also for a silicon nitride liner is a high-density plasma (HDP) or PECVD plasma treatment using silane at the data retention liner surface.

Either process results in making the surface silicon-rich which serves to block UV light At the current level of technology, the surface is about 50 Å thick.

The term "silicon-rich" as used herein means that the data retention liner 546 has a reflectivity index (RI) greater than about 2.5.

Figure 11:
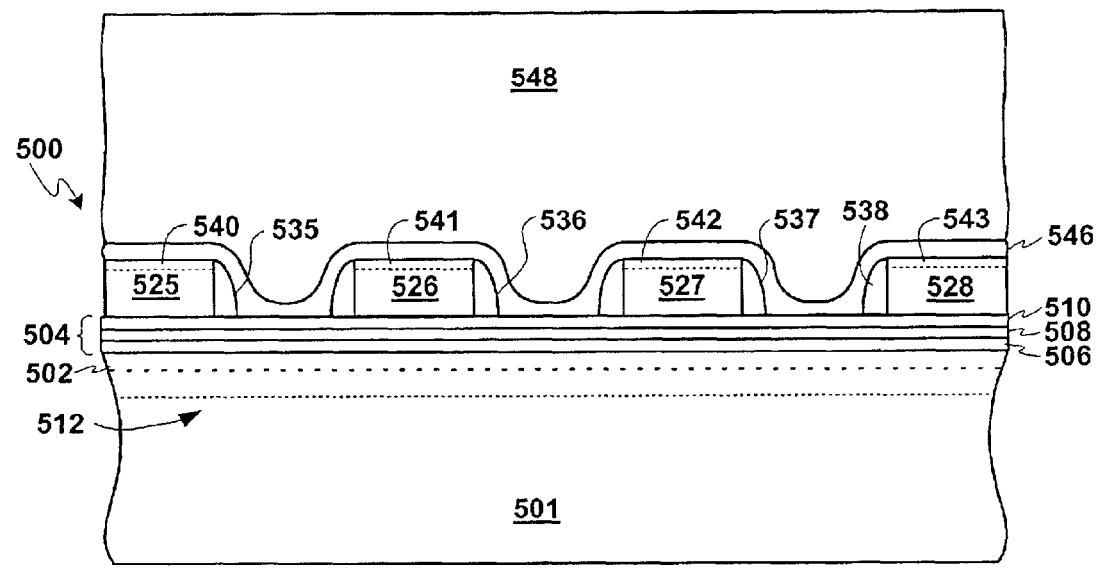
FIG. 11 is the structure of FIG. 10 after deposition of the first interlayer dielectric layer.

Referring now to FIG. 11, therein is shown the structure of FIG. 10 after deposition of the first interlayer dielectric layer 548 over the data retention liner 546 as one of the steps for completing the integrated circuit of which the memory cell is a portion The first interlayer dielectric layer 548 can be a material such as borophosphosilicate glass (BPSG).

Figure 12:
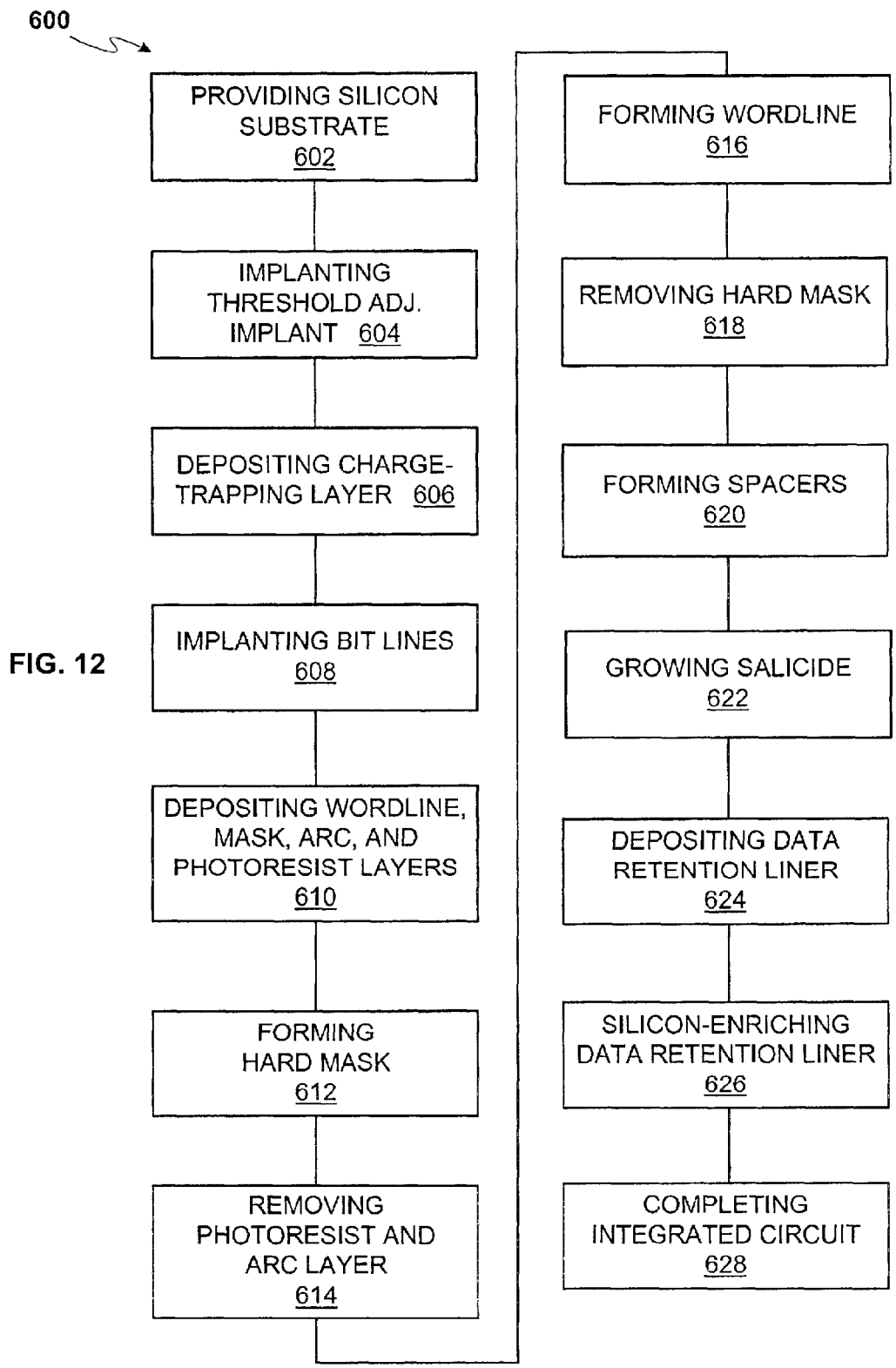
FIG. 12 is a simplified process chart according to the present invention.

Referring now to FIG. 12, therein is shown a simplified process chart 600 of the present invention which includes: providing semiconductor substrate 602; implanting threshold adjustment implant 604; depositing charge-trapping dielectric layer 606; implanting bitlines 608; depositing wordline, mask, ARC, and photoresist layers 610; forming hard mask 612; removing photoresist layer (and optional ARC material) 614; forming wordline 616; removing hard mask 618; forming spacer 620; growing salicide 622; depositing data retention liner 624; silicon-enriching data retention liner 626; and completing the integrated circuit 628. Various alternative sequences, additions, and deletions to this process chart would be obvious to those skilled in the art from a detailed reading of the present disclosure.

Various implementations of the method may be used in different electronic devices and especially the dual bit memory cell architecture may be achieved according to one or more aspects of the present invention. In particular, the invention is applicable to memory devices wherein both bits in a dual bit cell are used for data or information storage.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising:

depositing a charge-trapping material over a semiconductor substrate;

forming first and second bitlines in the semiconductor substrate;

depositing a wordline material over the charge-trapping material;

processing the wordline material using a photolithographic process to form a wordline;

depositing a data retention liner over the wordline and the charge-trapping material, the data retention liner having an ultra-violet blocking agent; and depositing an interlayer dielectric layer over the data retention liner.

2. The method of manufacturing an integrated circuit as claimed in claim 1 wherein depositing the data retention liner deposits a low hydrogen material.

3. The method of manufacturing an integrated circuit as claimed in claim 1 wherein depositing the data retention liner deposits a silicon compound and adding the ultra-violet blocking agent adds silicon.

4. The method of manufacturing an integrated circuit as claimed in claim 1 wherein depositing the data retention liner is done in an ammonia atmosphere.

5. The method of manufacturing an integrated circuit as claimed in claim 1 wherein depositing the data retention liner uses plasma enhanced chemical vapor deposition at a temperature above 500° C.

6. The method of manufacturing an integrated circuit as claimed in claim 1 wherein depositing the data retention liner uses a plasma enhanced chemical vapor deposition.

7. The method of manufacturing an integrated circuit as claimed in claim 1 further comprising implanting silicon ions in the data retention liner.

8. The method of manufacturing an integrated circuit as claimed in claim 1 further comprising implanting ions into the surface of the data retention liner and processing the data retention liner with a treatment to make the surface silicon-rich with a reflectivity index greater than about 2.5.

9. The method of manufacturing an integrated circuit as claimed in claim 1 wherein processing the data retention liner with a plasma treatment uses a treatment selected from a group consisting of a high-density plasma treatment, a plasma-enhanced chemical-vapor deposition, and a combination thereof.

10. The method of manufacturing an integrated circuit as claimed in claim 1 including depositing a spacer layer and forming a spacer around the wordline and wherein depositing the data retention liner includes depositing the data retention liner over the spacer.

11. A method of manufacturing an integrated circuit comprising:

depositing a charge-trapping material over a silicon substrate;

forming first and second bitlines in the silicon substrate;

depositing a wordline material over the charge-trapping material;

depositing a hard mask material over the wordline material;

depositing an anti-reflective coating material over the hard mask material;

depositing a photoresist material over the anti-reflective coating material;

processing the photoresist material and the anti-reflective coating material to form a photomask of a patterned photoresist material and a patterned anti-reflective coating material;

processing the hard mask material using the photomask to form a hard mask;

removing the patterned photoresist;

removing the patterned anti-reflective coating material without damaging material selected from a group consisting of the hard mask, the wordline material, and a combination thereon;

forming the wordline material using the hard mask and an anisotropic etch process to form a wordline;

removing the hard mask without damaging material selected from a group consisting of the wordline, the charge-trapping material, and a combination thereof;

depositing a data retention liner over the wordline and the charge-trapping material, the data retention liner, the data retention liner having reduced hydrogen and an ultra-violet blocking agent in the surface of the data retention liner; and completing the integrated circuit.

12. The method of manufacturing an integrated circuit as claimed in claim 11 wherein depositing the data retention liner deposits a silicon-nitride liner layer.

13. The method of manufacturing an integrated circuit as claimed in claim 11 wherein depositing the data retention liner uses a hydrosilane deposition.

14. The method of manufacturing an integrated circuit as claimed in claim 11 wherein depositing the data retention liner is done in an ammonia atmosphere.

15. The method of manufacturing an integrated circuit as claimed in claim 11 wherein depositing the data retention liner uses plasma enhanced chemical vapor deposition at a temperature above 500° C.

16. The method of manufacturing an integrated circuit as claimed in claim 11 wherein depositing the data retention liner uses a plasma enhanced chemical vapor deposition.

17. The method of manufacturing an integrated circuit as claimed in claim 11 further comprising implanting silicon ions in the data retention liner.

18. The method of manufacturing an integrated circuit as claimed in claim 11 further comprising implanting ions into the surface of the data retention liner and processing the data retention liner with a plasma treatment to make the surface silicon-rich with a reflectivity index greater than about 2.5.

19. The method of manufacturing an integrated circuit as claimed in claim 11 wherein processing the data retention liner with a plasma treatment uses a treatment selected from a group consisting of a high-density plasma treatment, a plasma-enhanced chemical-vapor deposition, and a combination thereof.

20. The method of manufacturing an integrated circuit as claimed in claim 11 including depositing a spacer layer and forming a spacer around the wordline and wherein depositing the data retention liner includes depositing the data retention liner over the spacer.

* * * * *

UNITED STATES PATENT AND TRADEMARK OFFICE
CERTIFICATE OF CORRECTION

PATENT NO. : 6,803,265 B1 Page 1 of 1
DATED : October 12, 2004
INVENTOR(S) : Ngo et al.

It is certified that error appears in the above-identified patent and that said Letters Patent is hereby corrected as shown below:

Column 1,
Line 19, delete "cost" and insert therefor -- cost. --
Line 34, delete "(SRAM" and insert therefor -- (SRAM) --
Line 65, delete "developed" and insert therefor -- developed. --

Column 2,
Line 61, delete "firm" and insert therefor -- form --
Line 65, delete "lo" and insert therefor -- to --

Column 7,
Line 37, delete "light" and insert therefor -- light. --
Line 45, delete "portion" and insert therefor -- portion. --

Column 9,
Line 20, delete "thereon" and insert therefor -- therefor --

Signed and Sealed this

Fifth Day of April, 2005

JON W. DUDAS
*Director of the United States Patent and Trademark Office*